United States Patent [19]
Harvey et al.

[11] Patent Number: 5,627,386
[45] Date of Patent: May 6, 1997

[54] SILICON NANOSTRUCTURE LIGHT-EMITTING DIODE

[75] Inventors: James F. Harvey, Research Triangle Park, N.C.; Robert A. Lux, Toms River, N.J.; Raphael Tsu, Charlotte, N.C.

[73] Assignee: The United States of America as represented by the Secretary of the Army, Washington, D.C.

[21] Appl. No.: 549,286

[22] Filed: Oct. 27, 1995

Related U.S. Application Data

[63] Continuation of Ser. No. 289,471, Aug. 11, 1994, abandoned.

[51] Int. Cl.$^6$ .................................................. H01L 27/15
[52] U.S. Cl. ................................................. 257/79; 257/95
[58] Field of Search .......................... 257/79, 80, 95, 257/81

[56] References Cited

PUBLICATIONS

R. Venkatasubramanian et al., Visible Light Emission from Quantized Planar GE Structures, Appl. Phys. Lett 59, 1603 (1991).

A.J. Steckl et al., Localized Fabrication of SI Nanostructures by Focused Ion Beam Implantation, Appl. Phys. Lett 60, 1833 (1992).

X.-Z. Tu, Fabrication of Silicon Microstructures Based on Selective Formation and Etching of Porous Silicon, Journal of Electrochemical Society 135, 2105 (1988).

R.M. Ostrom, D.M. Tanenbaum, and Alan Gallagher, Appl. Phys. Lett. 61, 925 (1992).

Fifth International Vacuum Microelectronics Conference, Vienna, Austria 13–17 Jul. 1992, Program and Abstracts.

P. Sutardja et al. Simulation of Stress Effects on Reaction Kinetics and Oxidant Diffusion in Silicon Oxidation, IEDM 86, 20.3.

R. Tsu, H. Shen, and M. Dutta, "Correlation of Raman and Photoluminescence Spectra of Porous Silicon," Appl. Phys. Lett. 60, 112 (1992).

H. Takagi et al., "Quantum Size Effects on Photoluminescence in Ultrafine Si Particles," Appl. Phys. Lett 56, 2379 (1990).

D.J. DiMaria et al., "Electroluminescence Studies in Silicon Dioxide Films Containing Tiny Silicon Islands," J. Appl. Phys. 56, 401 (1984).

J.F. Harvey et al. "Raman and Photoluminescence Studies of Porous Silicon," in Quantum Well and Superlattice Physics IV, ed. G.H. Doehler and E.S. Koteles, (SPIE vol. 1675, 1992), p. 134.

F. Namavar et al. "Visible Electroluminescence from Porous Silicon np Hetrojunction Diodes," Appl. Phys. Lett. 60, 2514 (May 1992).

*Primary Examiner*—Jerome Jackson, Jr.
*Assistant Examiner*—Nathan K. Kelley
*Attorney, Agent, or Firm*—Michael Zelenka; William H. Anderson

[57] ABSTRACT

The invention provides light sources which are easily compatible with standard silicon VLSI processing and can be located directly in the material of the silicon VLSI chip. P-type silicon substrate is processed to produce proturbances, the proturbances preferably having tip dimensions on the order of 5–10 mm. A native oxide film ($SiO_2$) is caused to develop on the surface of the silicon substrate. A thin, transparent, conductive film is then deposited on top of the $SiO_2$. Electrical contacts are made to the top of the conductive film and to the bottom of the silicon substrate. The carriers for electroluminescence are supplied by the P-doped silicon substrate (holes) and the conductive film (electrons). When a voltage is applied across the layers via the electrical contacts, the holes are concentrated in the region of the tip of the proturbances because the electric field lines concentrate near a pointed object, and electron current across the $SiO_2$ barrier in response to the voltage drop will be largest in the vicinity of the tip because the $SiO_2$ barrier is thinnest there, resulting in strong visible luminescence.

5 Claims, 2 Drawing Sheets

SILICON NANOSTRUCTURE LIGHT-EMITTING DIODE

GOVERNMENT INTEREST

The invention described herein may be manufactured, used, and licensed by or for the Government for governmental purposes without the payment to us of any royalty thereon.

This application is a continuation of application Ser. No. 08/289,471, filed Aug. 11, 1994, now abandoned.

FIELD OF THE INVENTION

This invention relates in general to electro-optics, and more particularly to electronic devices which employ semiconductor light sources.

BACKGROUND OF THE INVENTION

Semiconductor light sources are well-known in the field of electro-optics for providing a means for generating light within a silicon chip. Examples of such semiconductor light sources include, e.g., semiconductor lasers, light emitting diodes (LED's), and electroluminescent (EL) display devices. Such semiconductor light sources; have been fabricated from sophisticated and expensive compound semiconductor technologies. However, those technologies are not directly compatible with or applicable to silicon very large scale integration (VLSI) chips.

Integrated optics chips often incorporate a semiconductor light source on the same chip as other integrated electronic circuitry, which yields a device capable of high-speed processing. However, many current optoelectronic and display systems use VLSI chips for performing signal processing; since the semiconductor light source fabricating technologies have heretofore not been sufficiently compatible with or applicable to VLSI chips, semiconductor light sources have by necessity been provided on separate chips which are electrically interfaced with the silicon VLSI circuit chips where a light source is called-for.

Silicon has an indirect optical band gap; the recombination of electrons and holes in bulk crystalline silicon produces very weak luminescence in the infrared, making silicon an unsuitable material for light sources for displays or optoelectronic applications. As a result, display technologies and optoelectronic technologies have developed based on semiconductor materials better suited as light sources. Semiconductor display devices are generally based on materials such as ZnS with heavy doping. Optoelectronic IC's are generally based on ternary and quaternary semiconductors compatible with GaAs or InP substrates, which rely on one of the epitaxial crystal growth techniques. The processing of these materials is radically different than the processing of standard silicon VLSI IC's, and is more expensive. The fast computational and signal processing power which has been developed for silicon VLSI circuits is not available in these more complex materials. Furthermore, these materials are not as stable as silicon in electronic circuits. Systems applications requiring fast computing and signal processing require interfacing these more complicated technologies with the silicon VLSI chips. This results in added expense, added weight, and added complexity.

Silicon VLSi chips have reached a level of complexity such that a primary limitation in the overall system speed and computing power of VLSI circuitry is the speed of information flow through the interconnects between chips. The prior art has provided electrical connections as interconnects between VLSI chips. These electrical connections are subject to inherent delays due to the distributed inductances and capacitances in the interconnects themselves. High-speed optical interfacing between VLSI chips has been impractical due to the lack of a technology which enables semiconductor light sources to be incorporated into VLSI chips; and, electrical interfaces cannot match the high speed and high capacity that is provided by direct optical interfacing between circuits. And, electrical interfacing is complex, bulky, heavy, and expensive. The large number of interconnects which are required for modern chips have presented a space problem. That is, throughput between VLSI chips has been limited by the number of interconnects which will fit on the VLSI chip. In addition, the electrical interconnections are vulnerable to electromagnetic pulse (EMP) and other forms of electromagnetic interference (EMI). The electrical interconnects also emit electromagnetic radiation, which is susceptible to interception and thus poses a security risk.

Previous light sources, such as light emitting diodes (LED's), have been fabricated from GaAs, GaP, and other multiple component semiconductor materials. LED's made from direct gap semiconductor material such as GaAs, operate simply as a result of carrier recombination in a P-N junction. LED's fabricated from indirect gap material, such as GaP, are implanted to produce excitonic complexes which assist the recombination in the P-N junction. Since silicon is an indirect band gap semiconductor, it does not luminesce to a usable extent as a result of carrier recombination in P-N junctions. Attempts to create excitonic complexes to assist the recombination in bulk silicon, as is common in GaP, have proved insufficient.

The prior art also includes LED devices made from porous silicon. However, porous silicon is highly unstable chemically and physically, and is fabricated using a complex electrochemical etched method.

OBJECTS AND SUMMARY OF THE INVENTION

It is therefore an object of the invention to provide an electrically stimulated and controlled light source in silicon which is compatible with silicon VLSI circuits.

It is a further object of the invention to provide an improved silicon VLSI chip.

It is a further object of the invention to provide a means for interfacing VLSI chips with improved speed and capacity.

It is a further object of the invention to provide silicon VLSI circuits having decreased size and weight.

It is a further object of the invention to provide a high-speed silicon VLSI circuit which is less costly to produce than comparable circuits of the prior art.

The present invention provides a means for generating light directly in a silicon VLSI chip.

As set forth above, the indirect optical band gap of silicon has made it an unsuitable material for light sources for displays or optoelectronic applications. This invention provides light sources based on the recombination of electrons and holes in silicon structures. The light sources of the present invention are easily compatible with standard silicon VLSI processing, and therefore can be located directly in the material of the silicon VLSI chip. The light sources of the present invention generate light in the range of blue through near infrared, with the light wave length determined by the processing of the structures. The present invention provides light sources which can be produced so as to be very small, i.e., on the order of one micrometer (5 nm at the tip).

The present invention provides a light source on the silicon chip and integrated with it. The invention thus provides the capability to optically interconnect the VLSI chips. The optical interconnections have no inherent inductance and capacitance delays. Interconnection time is limited only by the speed of the light signals, and optical signals are capable of carrying many orders of magnitude more information than the electrical connections of the same size, thereby alleviating the interconnect throughput problem. And, these optical interconnects produce optical signals, which are far less subject to EMP, EMI, or intercept.

According to the invention, p-type silicon substrate is processed to produce protuberances, the protuberances preferably having tip dimensions on the order of 5–10 nm. A native oxide film ($SIO_2$) is then caused to develop on the surface of the silicon substrate. A thin, transparent, conductive film is then deposited on top of the $SiO_2$. Electrical contacts are made to the top of the conductive film and to the bottom of the silicon substrate. The carriers for electroluminescence are supplied by the P-doped silicon substrate (holes) and the conductive film (electrons). When a voltage is applied across the layers via the electrical contacts, the holes are concentrated in the region of the tip of the protuberances because the electric field lines concentrate near a pointed object, and electron current across the $SiO_2$ barrier in response to the voltage drop will be largest in the vicinity of the tip because the $SiO_2$ barrier is thinnest there. Thus, the carrier concentration will be greatest in the tip region, resulting in strong visible luminescence.

BRIEF DESCRIPTION OF THE DRAWINGS

These and other objects, features, and details of the invention will become apparent in light of the ensuing detailed disclosure, and in particularly in light of the drawings wherein.

DESCRIPTION OF THE PREFERRED EMBODIMENTS

Figure 1:
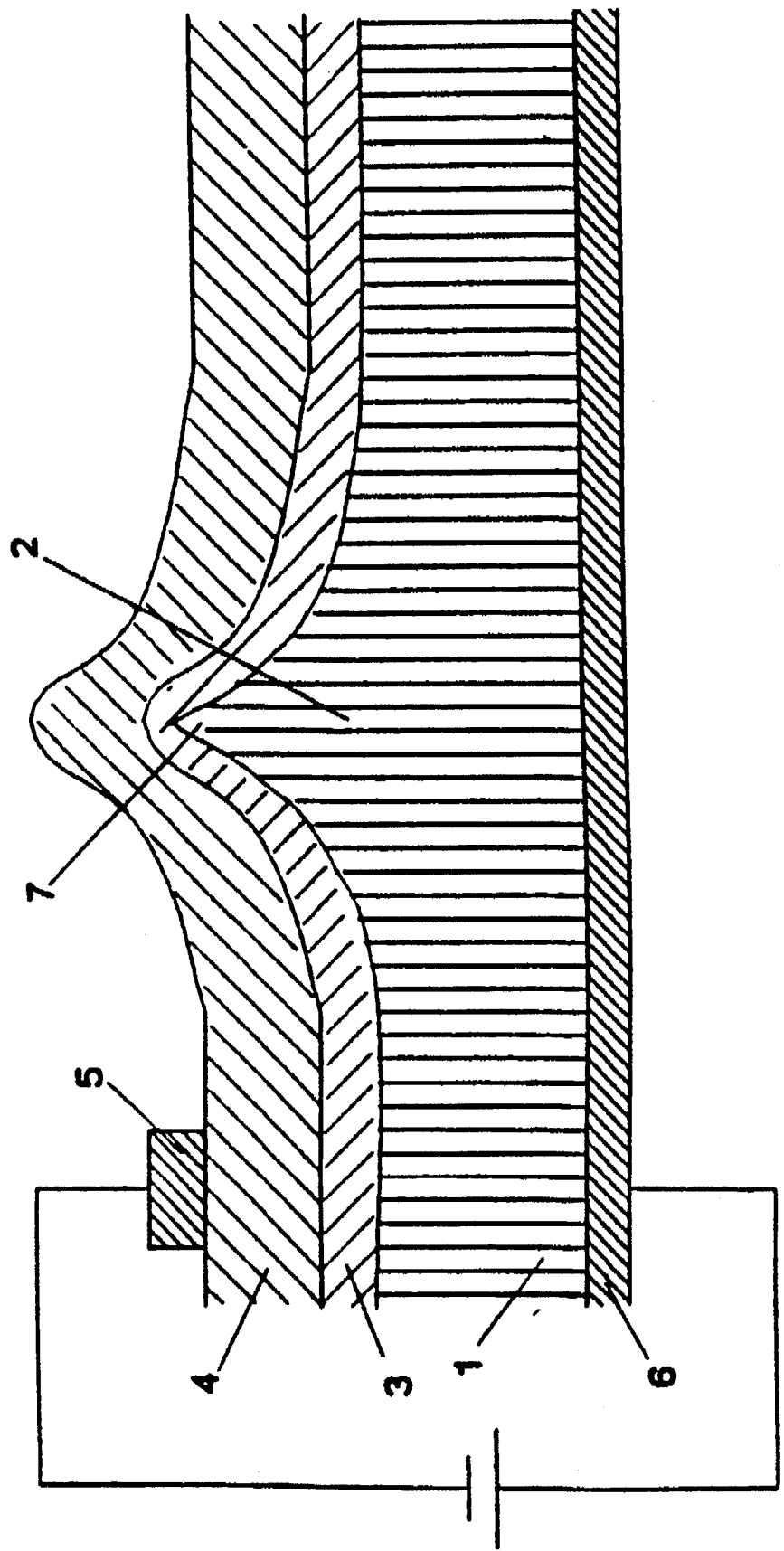
FIG. 1 is a cross section schematically showing principal features of the invention according to a first embodiment.

Referring to FIG. 1, a P-type silicon substrate 1 is processed to produce protuberances 2 at the surface. These protuberances or points can be fabricated by a number of different techniques. For example, the protuberances can be produced by etching under very small photoresist features. This process is described in more detail in R. Venkatsubramanian, et al., "Visible light emission from quantized planar Ge structures," Appl. Phys. Lett. 59, 1603 (1991), the entire disclosure of which is incorporated herein by reference. Another process for producing such protuberances includes etching under regions of selective ion beam implantation, as taught by A. J. Steckl, et al., "Localized fabrication of Si nanostructures by focused ion beam implantation," Appl. Phys. Lett. 60, 1833 (1992), the entire disclosure of which is incorporated herein by reference. A third method includes electrochemically etching under regions of ion implantation, as taught by X.-. Tu, "Fabrication of Silicon Microstructures Based on Selective Formation and Etching of Porous Silicon," J. Electrochem. Soc. 135, 2105 (1988), the entire disclosure of which is incorporated herein by reference. Yet another method uses a scanning tunneling electron microscope (STM) to build up a nanometer-size column, as taught by R. M. Ostrum, D. M. Tanenbaum, and Alan Gallagher, Appl. Phys. Lett. 61, 925 (1992), the entire disclosure of which is incorporated herein by reference. Yet another method for producing such protuberances uses lithographic techniques to fabricate needle structures in the silicon, as taught by Fifth International Vacuum Microelectronics Conference, Vienna, Austria, 13–17 July 1992, Program and Abstracts, the entire disclosure of which is incorporated herein by reference.

Regardless of the process used to produce the protuberances, it is preferable that they have tip dimensions on the order of 5–10 nm. The proturbance can be in the shape of a point or a ridge (knife edge). The surface of the silicon will develop a native oxide film 3 on the order of three nm thick from exposure to air for about twenty-four hours. Such a film can alternatively be developed by heating the silicon in air or other oxygen-containing ambient. The film will form preferentially where the silicon lattice is strained the least, that is, the oxide will be thinnest at the tip. For more detail see P. Stuardja, et al., "Simulation of Stress Effects on Reaction Kinetics and Oxidant Diffusion in Silicon Oxidation," IEDM 86, 20.3, the entire disclosure of which is incorporated herein by reference. A thin transparent conductive film 4 is deposited on top of the $SiO_2$. A thin gold or ITO (Indium Tin Oxide) film can be used. Contacts 5, 6 are made to the top of the conductive film and the bottom of the silicon substrate, respectively.

Knife-edge-shaped ridges of Ge, with feature sizes on the order of 5–10 nm at the tip, have been demonstrated to produce bright photoluminescence in the visible, due to the recombination of holes and electrons in the quantum confined region of the tip, even though Ge is an indirect band gap material like silicon. Other nanometer-sized structures in silicon, such as ultrasmall microcrystallites in porous silicon, tiny nanoclustures produced by chemical processes, and tiny particles of silicon embedded in $SiO_2$, are known to produce photoluminescence and electroluminescence. Quantum confinement of the carriers in the nanometer-scale Si structures, coupled with a possible more-highly-localized state, has been proposed as the mechanism for this luminescence. The quantum confinement is also responsible for shifting the silicon luminescence from the infrared (as in bulk silicon) to the visible region of the spectrum. The photoluminescence, where the carriers (holes and electrons) are produced by the incident light, has little value for electronic devices.

According to the present invention, however, the carriers are supplied by the p-doped silicon substrate (holes) and the conductive film (electrons) to produce electroluminescence, which can be used in light sources in electroluminescent displays and in optoelectronic light sources for uses such as fiber optic systems. When a voltage is applied across the layers, as shown in FIG. 1, the holes are concentrated in the region of the tip because the electric field lines concentrate near a pointed object. Electrons tunnel across the $SiO_2$ barrier 3 in response to the voltage drop. The electron current will be largest in the vicinity of the tip 7 because the $SiO_2$ barrier 3 is thinnest there. Thus, the carrier concentration will be greatest in the region of the tip 7, where the recombination will be quantum confined to a strong visible luminescence. Because most of the recombination will occur in this desirable region, the light source of the present invention will operate with great efficiency.

The present invention uses a relatively simple layered structure, which can be fabricated using standard lithographic techniques which are much more compatible with silicon VLSI circuitry.

Figure 2:
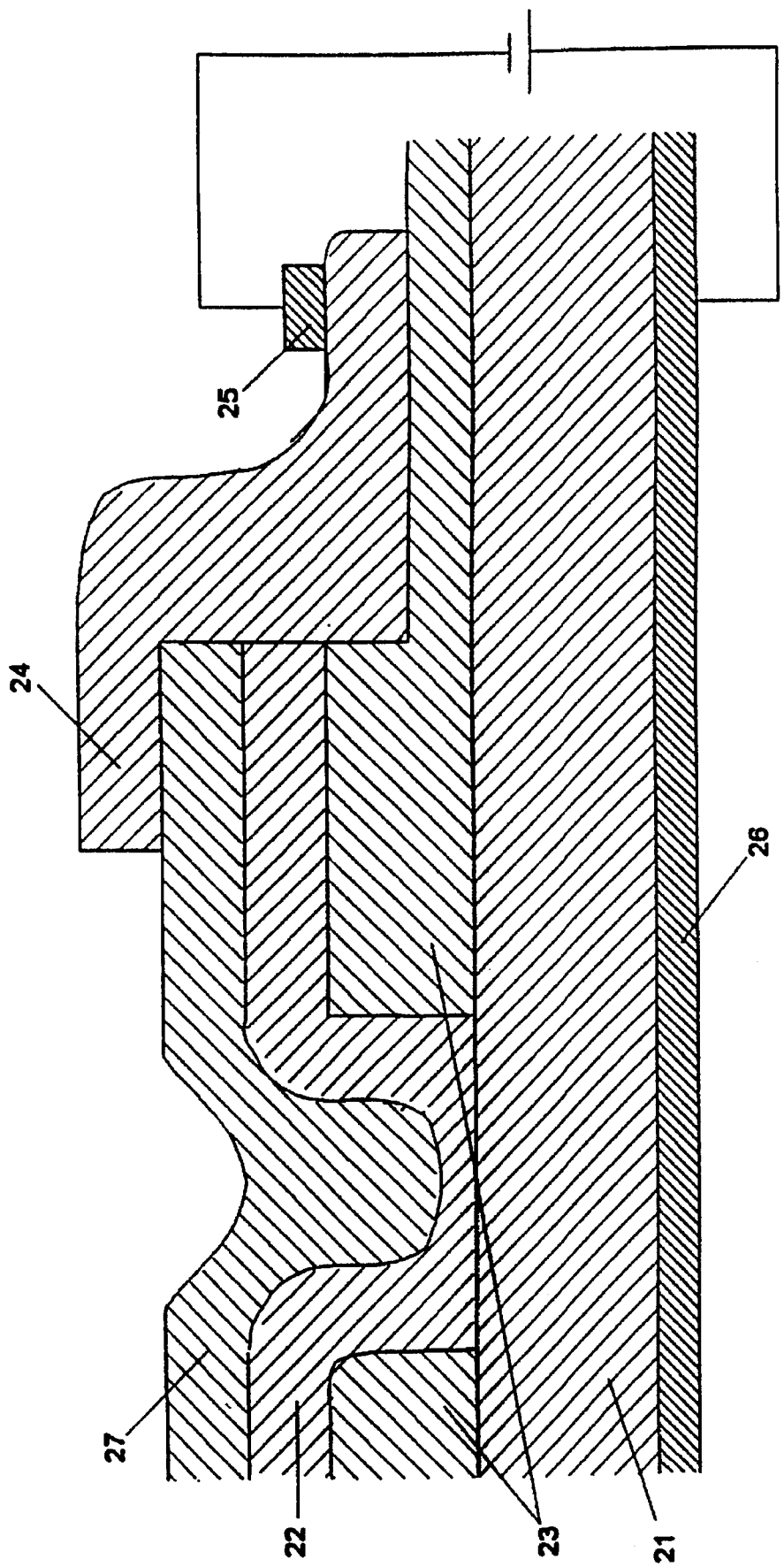
FIG. 2 is a cross section schematically showing principal features of the invention according to a second embodiment.

Referring to FIG. 2, an alternate embodiment of the invention uses a very thin layer of P-type poly-silicon 22 (approximately 5 mm thick) to form a quantum confined P-N junction with the ITO 24, which is an N-type material. In this embodiment, $SiO_2$ is deposited on a P-type silicon substrate 21, using a CVD process, to make a thick film 23. This film is etched back as shown in the drawing. A thin poly-silicon film 22 is deposited on top of the $SiO_2$ 23, making electrical contact with the substrate 21 through the etched window. A thick layer of $SiO_2$ 27 is deposited by CVD on the poly-silicon layer 22. Layers 22 and 27 are etched back as shown in FIG. 2. A layer of ITO 24 is deposited on the structure as shown in FIG. 2, making a P-N junction or a P-I-N junction with layer 22. A metal film (e.g., Al) 26 is deposited on the back of the substrate 21, making an electrical ohmic contact with it. A metal contact (e.g., gold) 25 is deposited on the ITO layer 24, making electrical ohmic contact with it.

When this structure is biased as shown in FIG. 2, holes are transported through the poly-silicon and electrons are transported through the ITO. They meet at the junction between the Poly-Silicon and the ITO and recombine, releasing light which propagates through the transparent ITO and $SiO_2$. The quantum confinement due to the very thin layer of poly-silicon and to the tiny silicon grains in the poly-silicon enhances the radiative recombination and shifts the light toward the visible wave lengths.

The present invention, therefore, provides a semiconductor light source whose structure enhances radiative recombination in silicon using quantum confinement. This structure is compatible with silicon VLSI processing technology and has improved stability and mechanical strength. The present invention can be applied to provide a light source in a display device integrated directly with VLSI silicon processing chips. The invention can further be applied to provide optoelectronic light sources located directly on a silicon VLSI chip. The invention can further be applied to provide light sources which are integrated into VLSI chips and thereby permit high-speed optical inter-chip interconnects. The invention can further be applied to provide a light source used as a driver for optically-controlled phased-array systems. And, the present invention can be applied to provide a light source used as a driver for optical fiber systems.

The light sources of the present invention emit light of a wave length in the range of blue through near infrared, with the wave length determined by the processing of the structures. These light sources are very small, on the order of 1 micrometer (5nm at the tip), and they can be made into arrays of any shape, with different elements of different colors, with the color region addressable electrically. The individual light source devices are surface-emitting, meaning that the light is emitted perpendicular to the surface. As a result, these devices can be easily arrayed to combine power, with the emitted power proportional to the surface area of the array and the density of the devices in the array. This arrangement also facilitates connection with optical fiber for external optoelectronic systems or for interconnection with other VLSI chips.

The light sources of the present invention can be applied to remoted radar or communications antennas, or to phased array radar or communication antennas controlled by optical fiber links.

While the invention has been particularly shown and described with reference to preferred embodiments thereof, it will be understood by those skilled in the art that various changes in form and details may be made therein without departing from the spirit and scope of the invention.

What is claimed is:

1. A semiconductor light source, comprising a nonporous silicon substrate having at least one external protuberance on an emitting surface of said silicon substrate;

an oxide film on said emitting surface of said silicon substrate, said oxide film covering the entire external protuberance;

a conductive film entirely covering said oxide film that covers said external protuberance; and means to apply an electrical bias across said silicon substrate, oxide film and said conductive film.

2. The light source according to claim 1, wherein said silicon substrate comprises a P-type silicon substrate.

3. The light source according to claim 1, wherein said oxide film comprises $SiO_2$.

4. The light source according to claim 1, wherein said conductive film comprises gold.

5. The light source according to claim 1, wherein said conductive film comprises Indium Tin Oxide.

* * * * *